United States Patent
Chao et al.

(10) Patent No.: US 9,843,336 B1
(45) Date of Patent: Dec. 12, 2017

(54) SYSTEM AND METHOD OF MINIMIZING DIFFERENTIAL NON-LINEARITY (DNL) FOR HIGH RESOLUTION CURRENT STEERING DAC

(71) Applicants: Yuan-Ju Chao, Cupertino, CA (US); Ta-Shun Chu, Hsunchu (TW)

(72) Inventors: Yuan-Ju Chao, Cupertino, CA (US); Ta-Shun Chu, Hsunchu (TW)

( * ) Notice: Subject to any disclaimer, the term of this patent is extended or adjusted under 35 U.S.C. 154(b) by 0 days.

(21) Appl. No.: 15/494,533

(22) Filed: Apr. 23, 2017

Related U.S. Application Data

(63) Continuation of application No. 15/225,016, filed on Aug. 1, 2016.

(51) Int. Cl.
*H03M 1/66* (2006.01)
*H03M 1/06* (2006.01)
*H03M 1/68* (2006.01)

(52) U.S. Cl.
CPC ......... *H03M 1/0612* (2013.01); *H03M 1/662* (2013.01); *H03M 1/687* (2013.01)

(58) Field of Classification Search
CPC ..... H03M 1/0612; H03M 1/662; H03M 1/687
USPC .................................. 341/118, 144
See application file for complete search history.

(56) References Cited

U.S. PATENT DOCUMENTS

| | | | | |
|---|---|---|---|---|
| 7,812,751 B2* | 10/2010 | Eloranta | ................ | H03H 15/00 341/136 |
| 9,323,273 B2* | 4/2016 | Wang | ...................... | G05F 3/262 |
| 9,419,636 B1* | 8/2016 | Graham | .................. | H03M 1/66 |
| 9,584,152 B1* | 2/2017 | Sheng | ..................... | H03M 1/66 |

\* cited by examiner

*Primary Examiner* — Brian Young
(74) *Attorney, Agent, or Firm* — Tran & Associates

(57) ABSTRACT

A current steering converter fabricated using a predetermined integrated circuit technology includes a unary portion having one or more current sources and a binary portion including a plurality of switches controlled by a decoder, the switches coupled to a converter output; and a plurality of devices commonly connected at a first end and coupled to each respective switch at a second end, wherein each device size comprises (W/L)*M, where W/L is a width and length of the device and M is an integer representing multiple number.

10 Claims, 7 Drawing Sheets

SYSTEM AND METHOD OF MINIMIZING DIFFERENTIAL NON-LINEARITY (DNL) FOR HIGH RESOLUTION CURRENT STEERING DAC

BACKGROUND

The present invention is related to digital-to-analog converters (DACs).

Current steering DAC is based on an array of matched current cells elements that are steered to the DAC output depending on the digital input code. The DAC can be implemented either in a binary or unary structures. In a binary implementation, a current switched to the output is directly proportional to the binary weight of the corresponding bit in the input word. The binary weighted DAC suffer from large mismatch errors due to a number of current source switches during code change. In contrary, for the unary implementation, every current source provides the same current, and is switched independently. The digital input code is first decoded to thermometer code. This thermometer code is then used to control the switches. The fully unary implementations can obtain good linearity performance but add complexity and spend more power consumption.

The segmented implementation combines the previous two structures by introducing thermometer decoding for a few of the most significant bits (MSB's) and using binary weight structure on the few least significant bits (LSB's) bits. Segmentation DAC provides a trade-off between complexity, speed, power and performance.

Due to the process variation during IC fabrication, the attributes of transistors such as oxide thickness, width and length vary. For analog circuit, this variance can be represented as mismatch. Transistor mismatch in the current sources of DAC introduces different amount of current into the load. This mismatch error is the main source of converter nonlinearity.

In order to minimize the mismatch between different devices, the same device dimension should be used. Use multiple of the same dimension device can achieve a better matching for current sources. However, for high resolution, low power featured segmented current steering DAC, the device is decreased such that the device size is limited by the technology design rule. It is very difficult to get good differential non-linearity (DNL) for high resolution and low power current steering DAC.

SUMMARY

A current steering converter fabricated using a predetermined integrated circuit technology includes a unary portion having one or more current sources and a binary portion including a plurality of switches controlled by a decoder, the switches coupled to a converter output; and a plurality of devices commonly connected at a first end and coupled to each respective switch at a second end, wherein each device size comprises (W/L)*M, where W and L is the width and length of the device and M is an integer representing multiple number of the device.

Advantages of the converter may include one or more of the following. The present converter provides an accurate splitting of the current source for current steering DAC. The process of doubling the device size and then splitting into two halves reduces the mismatch of the device and improves the DAC linearity. A trimming method is presented to further adjust the current that can achieve small DNL for high-resolution high accuracy current steering DAC.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION

Figure 1:
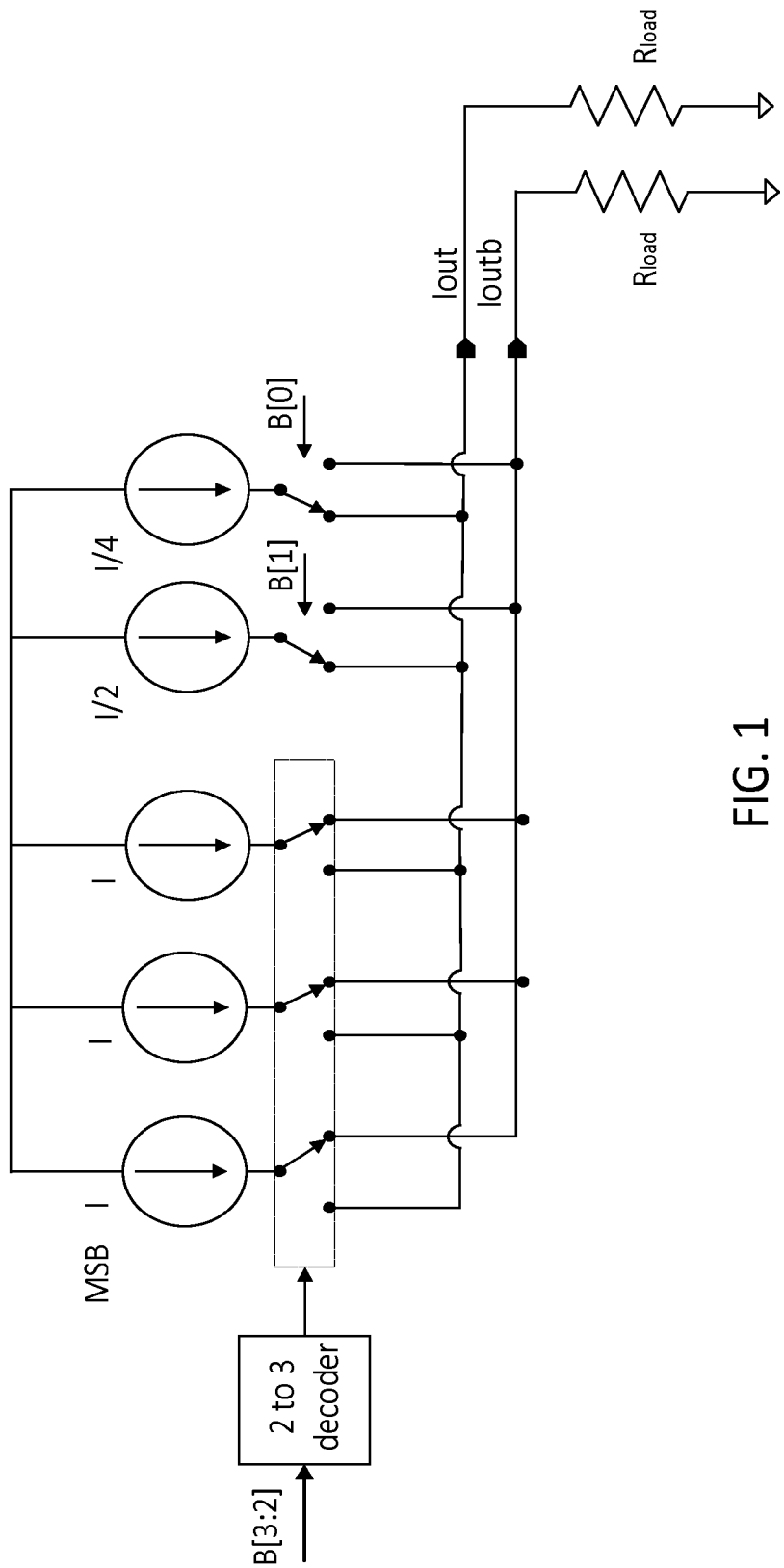
FIG. 1 illustrates a basic architecture of 4-bit segmented current steering DAC.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

FIG. 1 shows a basic 4-bit segmented current steering DAC. The DAC is segmented into 2-bit binary and 2-bit unary current sources that steer current to either the positive or negative terminals based on the input bits. A 2-to-3 decoder is needed to convert the two uppermost input bits into thermometer code. The two terminals are connected to resistor load to convert current into voltage.

Figure 2:
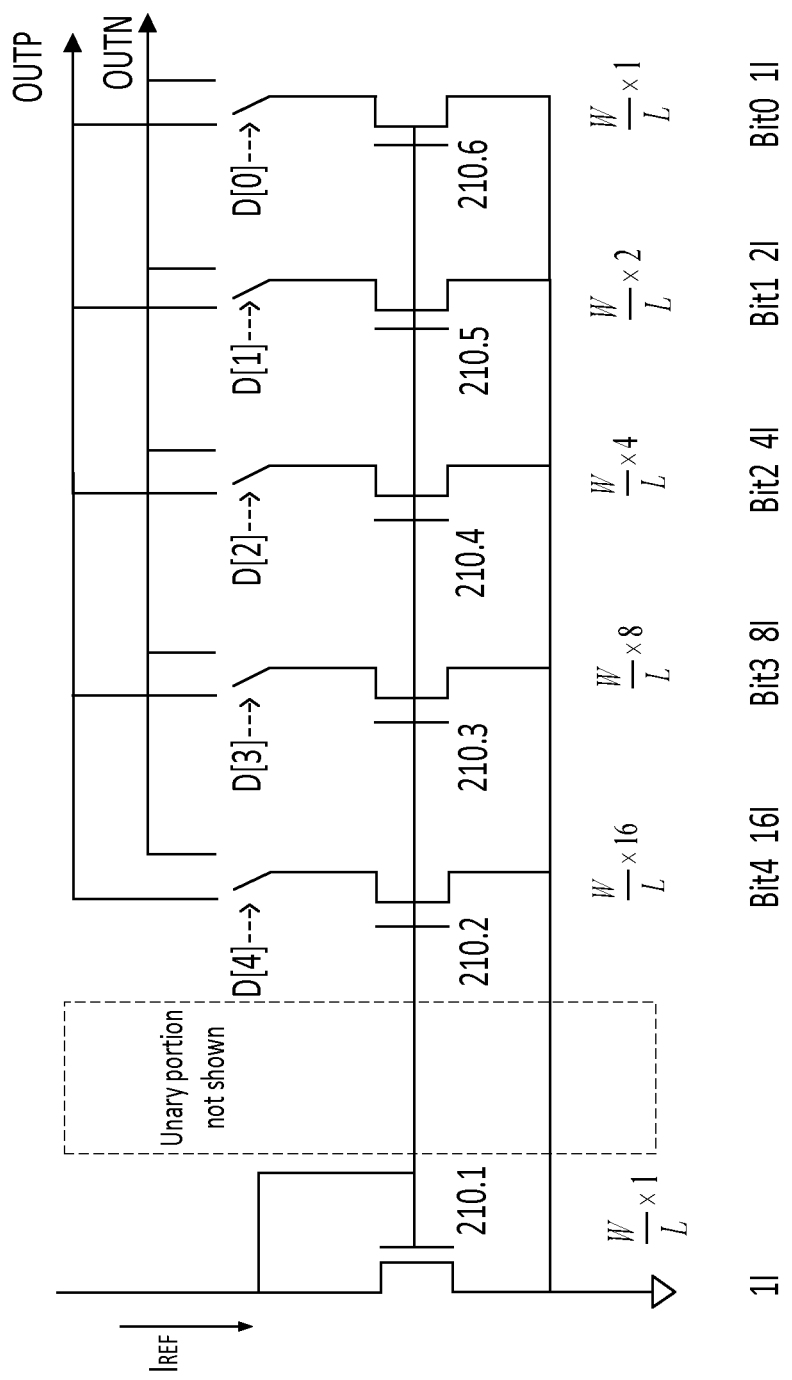
FIG. 2 shows an exemplary 5-bit binary portion of high resolution current steering DAC.

FIG. 2 shows a 13-bit DAC using 8 unary and 5 binary segmented architecture. The illustration only shows the binary part and the unary portion is not shown. Each NMOS device size is described as (W/L)*M, where W and L is the width and length of each device and M is a multiple number. The multiple number M for Bit0, Bit1, Bit2, Bit3 and Bit4 are 1, 2, 4, 8 and 16 respectively. The mismatch between the current sources created error in terms of current amount and the errors represent the nonlinearity of the DAC. The main mismatch sources between two MOS devices are threshold voltage mismatch $A_{vt}$ and conductance parameter mismatch $A_\beta$. $A_{vt}$ and $A_\beta$ are given for one specific technology and both $A_{vt}$ and $A_\beta$ are inversely proportional to the square root of the device area.

$$\sigma_{Vt} = \frac{A_{Vt}}{\sqrt{WL}}$$

$$\frac{\sigma(\Delta\beta)}{\beta} = \frac{A_\beta}{\sqrt{WL}}$$

where σ is the standard deviation of Gaussian distribution

For 5-bit binary implementation, the total number of M is 31 which represents 31 current sources. The maximum differential non-linearity (DNL) happens at the mid-scale when input code 01111 switches to 10000, where 15 current sources from Bit0 to Bit3 turn off and 16 current sources of Bit4 turn on. For N-bit binary current steering DAC, assuming currents sources errors are not correlated, the maximum DNL can be described as the following equation:

$$\sigma_{DNL,max} = \sqrt{2^N - 1}\frac{\sigma(I)}{I} \cong 2^{N/2}\frac{\sigma(I)}{I}$$

$\frac{\sigma(I)}{I}$ = unit current standard deviation unit current standard deviation
N is Total Number of Binary Bits To minimize the mismatch of the current sources, the circuit embodiment on FIG. 2 uses only one same dimension W/L for the 31 current sources, the difference between these 31 current source is the multiple number M. For the physical implementation or mask layout, using the exactly same dimension enable a very symmetrical floorplan which helps to minimize the mismatch of the physical layout implementation in addition to inherent device mismatch.

However, for the applications require high resolution and very low power features, the current amount is reduced in such a way that the dimension of the device reaches the minimum size of the technology accordingly to MOSFET IV characteristic equation:

$$I_D = \frac{1}{2}u_n C_{ox}\frac{W}{L}(V_{GS} - V_{TH})^2$$

Figure 3:
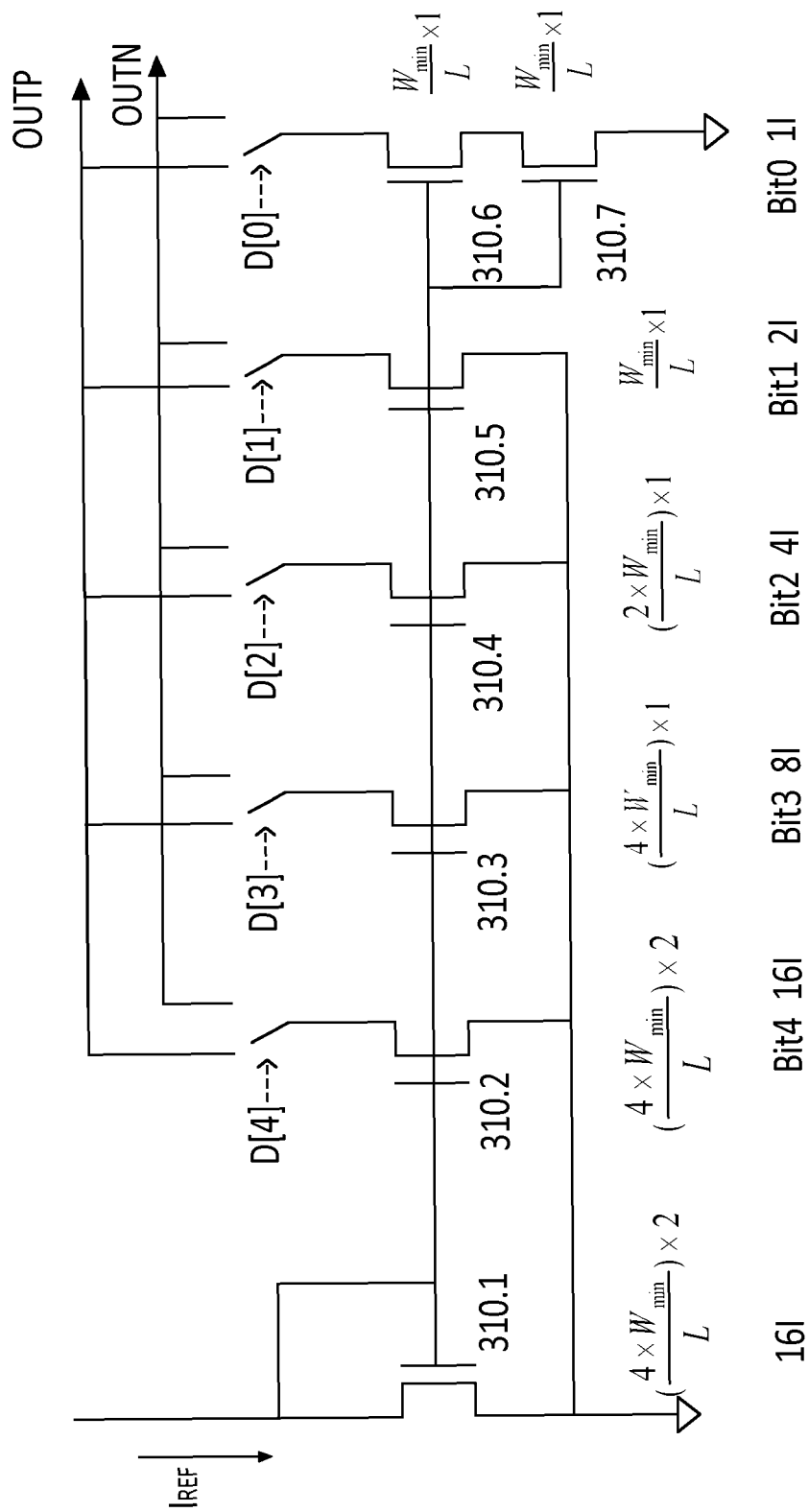
FIG. 3 shows an exemplary 5-bit binary portion of low power current steering DAC.

$I_D$ is the current going through the device
$u_n C_{ox}$ is the product of the electron mobility and the oxide layer capacitance
$(V_{GS}-V_{TH})$ is the difference between gate to source voltage and threshold voltage FIG. 3 illustrates the 5-bit binary current source of the low power current steering DAC. $W_{min}$ is the minimum width allowed in the technology design rule. In this case, Bit4 current source 310.2 uses the same dimension of the reference current source 310.1. Bit3 uses half of the multiple number to cut the current by half. Bit2 and Bit1 cut the device width by half and by a quarter respectively to further decrease the current. For Bit0, it has reaches the minimum width so two minimum size are stack up in series which effectively reduce the W/L ratio by half.

Note that the mismatches of devices 310.4, 310.5, 310.6 and 310.7 are worse than 310.3 since different device widths are used. Once the physical dimension is different the threshold voltage will be different especially for advanced deep submicron technology which has very thin oxide thickness. Compared with FIG. 2 the maximum DNL of this 5-bit binary current sources in FIG. 3 is much worse due to the different physical dimension and decreased device size. For the applications that require monotonic DAC characteristic with very low power feature, the structure of FIG. 3 is very difficult to meet half LSB DNL specification.

Figure 4:
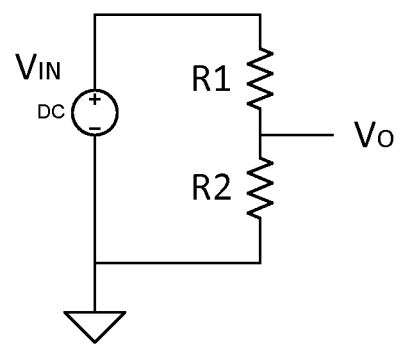
FIG. 4 shows an exemplary diagram of voltage divider.

Instead of reducing the device size, the same device size can be used if the current can be split equally. FIG. 4 shows a diagram of voltage divider, Vo voltage is half of $V_{IN}$ when the value of $R_1$ equals $R_2$. The same concept can be applied to split the current into two half currents. According to an embodiment illustrated in FIG. 5, a reference circuit $I_B$ can be split into $I_1$ and $I_2$. The resistances $R_1$ and $R_2$ looking into 510 and 520 have to be the same to make $I_1$ current has the same amount of $I_2$.

Figure 6:
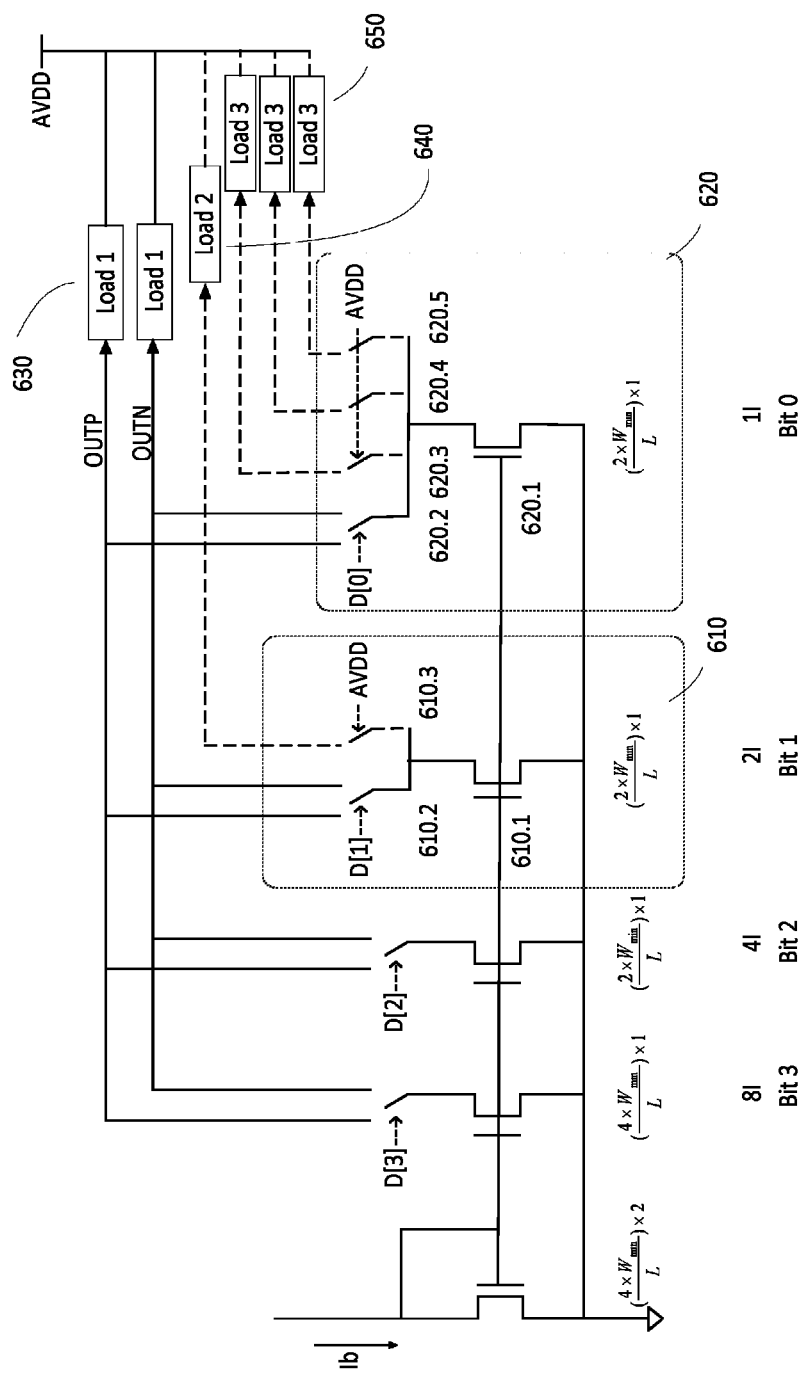
FIG. 6 shows an exemplary circuit diagram of current source splitting by 2 and 4.

FIG. 6 illustrates a circuit diagram of current splitting scheme used on last 2 bits Bit 1 610 and Bit 0 620. As the diagram describes, Bit 2, Bit 1 and Bit 0 should have the 4I, 2I and 1I amount of current respectively by their binary representation. The device dimension of Bit 2 current source is (2*W/L). For Bit 1, it uses the same device size (2*W/L) and split the current into two halves. There are two switches 610.2 and 610.3 connecting to Bit 1 current source 610.1 but only switch 610.2 is controlled by input data D[1]. Only the current out of switch 610.2 is directed to output nodes OUTP/OUTN. The output of another switch 610.3 is connected to Load 2 640 which is not coupled with DAC outputs OUTP/OUTN. Note that only the current flowing to Load1 630 is associated with DAC's differential outputs OUTP/OUTN. The current flowing into Load2 640 doesn't contribute to differential voltage OUTP/OUTN. Similarly for LSB Bit 0, there are four switches 620.2, 620.3, 620.4 and 620.5 connecting to current source device 620.1 but only the output of switch 620.2 is connected to DAC's output node OUTP/OUTN. The outputs of other three switches are connected to Load 3 650 which is not coupled with DAC's outputs OUTP/OUTN. The currents that go to OUTP/OUTN are illustrated in solid line while the currents that don't connect to DAC outputs are illustrated in dash lines on FIG. 6.

With this current splitting implementation, Bit 1 610 and Bit 0 620 use the exact same current source device dimension as Bit 2 to minimize the mismatch between these current sources. Using the exact same device dimension (W/L)*M with the same width, length and multiple number ensures these devices can be placed right next to each other during layout and they are surrounded in the same physical environment and pattern. Using the exact size dimension will minimize the difference between these current sources and a good matching characteristic can be achieved during IC fabrication.

Instead of reducing the device size and introducing mismatch, current splitting method use the same device size and diverts the needed current amount to DAC's loading elements. The unneeded current is diverted to another load which is not coupled to DAC's outputs. The overhead of the current splitting structure is some extra current since the extra amount of current is produced but not used. However, the current amount of last few less significant bits are very small and is considered negligible compared with the total DAC's full scale current.

Figure 5:
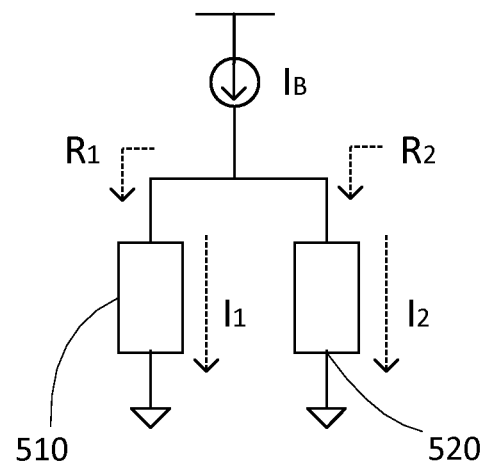
FIG. 5 shows an exemplary of current divider.

As explained in FIG. 5 earlier, the electrical characteristic looking into load elements has to be the same to equally separate the current. The equivalent resistances looking into Load 1 630 and Load 2 640 need to be the same in order to split the current equally into 2 load elements. Similarly, the equivalent resistances looking into Load 2 640 and Load 3 650 need to be the same so that only one quarter of the current from current source 620.1 is sent to DAC's outputs OUTP/OUTN.

Note that there is also mismatch between two load elements. This mismatch of the load elements exists regardless of using current splitting implementation or not. The mismatch of load elements is considered as one of the mismatch sources of DAC and should be minimized in such a way that the overall DAC linearity is limited by the current source mismatch. There are multiple sources of mismatch like threshold voltage mismatch $A_{vt}$ and conductance parameter mismatch $A_\beta$ for active MOS devices NFET or PFET which are used in the current sources. However, for passive resistor load element which most DAC's use, the source of mismatch is purely the dimension difference between these elements. Also the number of load elements is only two whereas the number of unit current sources can be $2^N$ for N-bit current steering DAC. Thus the mismatch contribution of load elements to the overall DAC's mismatch is much smaller compared with the contribution of the current sources. Besides, since the load elements only occupy a very small percentage of the total DAC layout area, the size of the load element can be sized up with the same width/length ratio to reduce the mismatch while maintaining the same resistor value.

Figure 7:
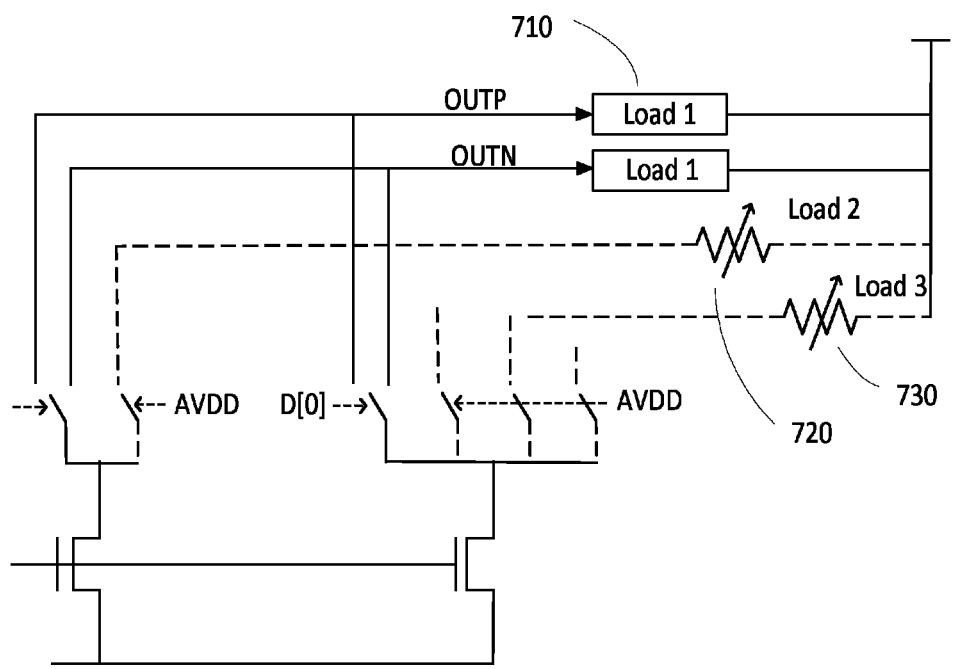
FIG. 7 shows an exemplary circuit diagram of adjustable current source splitting.

Even a good design practice of using the same dimension, same rotation, same surrounding environment has been made to minimize the mismatch of current sources, there still exists a random mismatch between devices due to lithography variation, process variations and physical gradients from IC manufacturing. This random mismatch will change the equivalent resistance of the load elements from one silicon part to another silicon part. To achieve higher accuracy of current source, further trimming can be applied on the load elements to adjust the current amount. This load trimming method is illustrated on FIG. 7. DAC's load element Load 1 720 is a fixed value load while Load 2 720 and Load 3 730 are load elements that their equivalent resistance can be adjusted. Users adjust Load 2 720 and Load 3 730 equivalent resistance respectively to match DAC's Load 1 710. By adjusting the equivalent resistance of the load, the desired current amount can be accurately obtained to minimize the DAC nonlinearity after IC is fabricated. The trimming reduces the mismatch either the mismatch is the systematic mismatch due to design or the statistical random mismatch due to process variation.

Figure 8A:
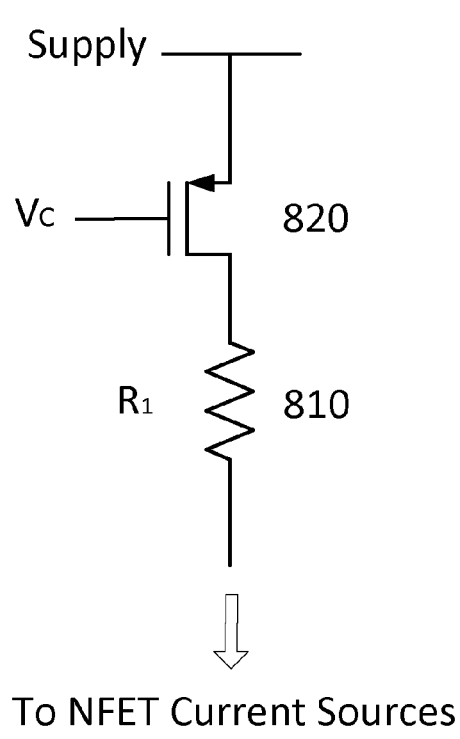
FIG. 8A-8B shows an exemplary diagram of resistive load to trim current sources.
Figure 8B:
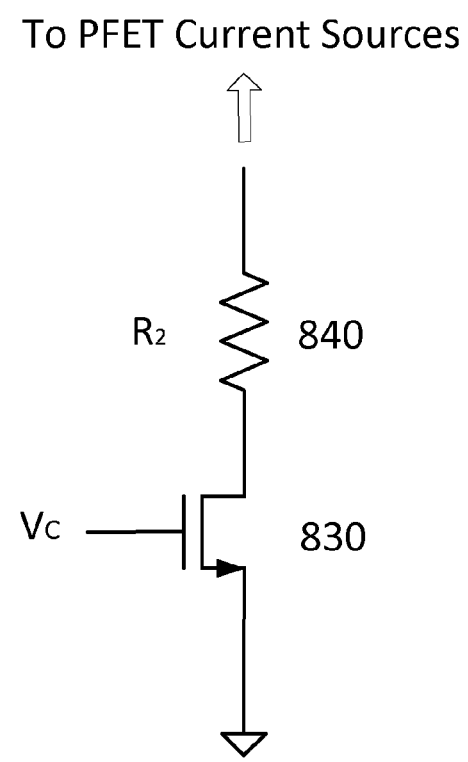

FIG. 8A and FIG. 8B illustrates possible trimming structures of the load element for current steering DAC. FIG. 8A is used for NFET current sources and FIG. 8B is used for PFET current sources. The load element consists of a fixed value resistor 810 and a gate controlled PFET device 820. The PFET device 820 is biased and operated at its linear region with the resistance value described below. The total equivalent resistance $R_T$ is the sum of the two resistance values.

$$R_T = R_1 + R_{ds} = R_1 + \frac{1}{u_n C_{ox} \frac{W}{L}(V_C - V_{TH})}$$

$$R_{ds} = \frac{1}{u_n C_{ox} \frac{W}{L}(V_C - V_{TH})}$$

is the equivalent resistance of the NFET in linear region

By changing the control voltage $V_c$, the resistance of the load element can be adjusted to be the exact desired value such that the current amount from the current splitting switch is the right value to the DAC output nodes OUTP/OUTN. The trimming on current splitting load element produces the accurate current and minimize the nonlinearity of high-resolution low power current steering DAC.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A current steering converter fabricated using a predetermined integrated circuit technology, comprising:
   a unary portion having one or more current sources;
   a binary portion including:
      a plurality of switches controlled by a decoder, the switches coupled to a converter output; and
      a plurality of devices commonly connected at a first end and coupled to each respective switch at a second end, wherein each device size comprises (W/L)*M, where W/L is a width and length and M is an integer representing multiple number; and
   a reference source coupled to the devices, wherein the current from the reference source is split equally using a current divider.

2. The converter of claim 1, wherein the devices comprise NMOS current sources or PMOS current sources.

3. The converter of claim 1, wherein the dimensions of the device reaches a minimum size of the technology.

4. The converter of claim 1, wherein the least-significant-bit (LSB) comprises two devices coupled in series, each having a dimension of $(W_{min}/L)*M$, and the most significant-bit (MSB) uses the dimension of a reference current source, and each bit in between uses half of the multiple number to cut the current by half, and where $W_{min}$ is the minimum width allowed in the technology design rule.

5. The converter of claim 1, comprising an LSB bit 0, bit 1 and bit 2, wherein bit 1 has the same device size as bit 2 and splits the current by two with two switches connecting to a bit 1 device with one switch is connected to the converter output, wherein bit 0 has the same device size as bit 2 and splits the current by four with four switches connecting to a bit 0 device with one switch is connected to the converter outputs.

6. The converter of claim 5, wherein the resistance of a resistor not connected to the converter output is trimmed to compensate for device fabrication mismatch.

7. The converter of claim 6, wherein the adjustable load element consists of a fixed value passive resistor and an active PMOS or NMOS transistor with controlled gate voltage.

8. A method for fabricating a current steering converter with a predetermined integrated circuit technology, comprising:
  forming a unary portion having one or more current sources;
  forming a binary portion including a plurality of switches controlled by a decoder, the switches coupled to a converter output; and
  specifying a layout for a plurality of devices commonly connected at a first end and coupled to each respective switch at a second end, wherein each device size comprises (W/L)*M, where W/L is a width and length of the device and M is an integer representing multiple number; and
  generating a current from a reference source coupled to the devices, wherein the current from the reference source is split equally using a divider for the device dimension to reach a minimize size of the technology.

9. The method of claim 8, comprising forming an LSB bit 0, bit 1 and bit 2, wherein bit 1 has the same device size as bit 2 and splits the current by two with two switches connecting to a bit 1 device with one switch is connected to the converter output, wherein bit 0 has the same device size as bit 2 and splits the current by four with four switches connecting to a bit 0 device with one switch is connected to the converter output.

10. The method of claim 9, wherein the resistance of the resistor not connected to the converter output is trimmed to compensate for device fabrication mismatch.

\* \* \* \* \*